United States Patent
Huang et al.

(10) Patent No.: US 11,062,898 B2
(45) Date of Patent: Jul. 13, 2021

(54) PARTICLE REMOVAL APPARATUS, PARTICLE REMOVAL SYSTEM AND PARTICLE REMOVAL METHOD

(71) Applicant: Taiwan Semiconductor Manufacturing Co., Ltd., Hsinchu (TW)

(72) Inventors: Siao-Chian Huang, Hsinchu (TW); Po-Chung Cheng, Zhongpu Shiang (TW); Ching-Juinn Huang, Changhua (TW); Tzung-Chi Fu, Miaoli (TW); Tsung-Yen Lee, Jhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 92 days.

(21) Appl. No.: 16/182,771

(22) Filed: Nov. 7, 2018

(65) Prior Publication Data

US 2020/0035483 A1    Jan. 30, 2020

Related U.S. Application Data

(60) Provisional application No. 62/711,678, filed on Jul. 30, 2018.

(51) Int. Cl.
*H01L 21/02* (2006.01)
*H01L 21/67* (2006.01)
(Continued)

(52) U.S. Cl.
CPC .......... *H01L 21/02057* (2013.01); *B08B 3/08* (2013.01); *B08B 5/04* (2013.01); *G03F 7/70925* (2013.01); *H01L 21/67023* (2013.01)

(58) Field of Classification Search
CPC .... B08B 3/08; B08B 5/04; B08B 3/02; B08B 3/04; B08B 5/02; G03F 7/70925;
(Continued)

(56) References Cited

U.S. PATENT DOCUMENTS 5,000,203 A * 3/1991 Hamada ................... B03C 1/00
                                                            134/1
5,634,230 A * 6/1997 Maurer ..................... G03F 1/84
                                                            15/1.51

(Continued)

OTHER PUBLICATIONS

Definition of "Baffle" from https://www.merriam-webster.com/dictionary/baffle (Year: 2020).*

*Primary Examiner* — Douglas Lee
(74) *Attorney, Agent, or Firm* — McClure, Qualey & Rodack, LLP

(57) ABSTRACT

A particle removal apparatus is provided. The particle removal apparatus includes a reticle holder configured to hold a reticle. The particle removal apparatus further includes a robotic arm. The particle removal apparatus also includes a particle removal device disposed on the robotic arm, and the particle removal device includes a solution spraying module. In addition, the robotic arm and the particle removal device are configured to align with a particle on a backside of the reticle, and the solution spraying module is configured to spray a solution onto the particle to remove the particle.

20 Claims, 13 Drawing Sheets

(51) Int. Cl.
*B08B 3/08* (2006.01)
*G03F 7/20* (2006.01)
*B08B 5/04* (2006.01)

(58) Field of Classification Search
CPC ... G03F 1/82; G03F 1/84; G03F 7/707; G03F 7/70741; H01L 21/02057; H01L 21/67023; H01L 21/67028; H01L 21/67034; H01L 21/67051; H01L 21/67253; H01L 21/6708; H01L 21/02041; H01L 21/6838
See application file for complete search history.

(56) References Cited

U.S. PATENT DOCUMENTS

| | | | |
|---|---|---|---|
| 7,231,682 B1 * | 6/2007 | Boyd | B08B 3/12 15/77 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2008/0078421 A1 * | 4/2008 | O'Donnell | H01L 21/6708 134/2 |
| 2008/0137047 A1 * | 6/2008 | Mizutani | G03F 7/70975 355/30 |
| 2009/0027635 A1 * | 1/2009 | De Jong | G03F 7/70341 355/30 |
| 2015/0239020 A1 * | 8/2015 | Ponomarev | B24C 5/005 134/1 |
| 2016/0296982 A1 * | 10/2016 | Hirakawa | B08B 5/04 |
| 2017/0368579 A1 * | 12/2017 | Prus | B08B 9/00 |

* cited by examiner

PARTICLE REMOVAL APPARATUS, PARTICLE REMOVAL SYSTEM AND PARTICLE REMOVAL METHOD

PRIORITY CLAIM AND CROSS-REFERENCE

This application claims the benefit of U.S. Provisional Application No. 62/711,678, filed on Jul. 30, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel target droplets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for lithography process have been adequate for their intended purposes, they have not been entirely satisfactory in all respects. Consequently, it would be desirable to provide a solution for improving the yield rate and reducing the effects of particles.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
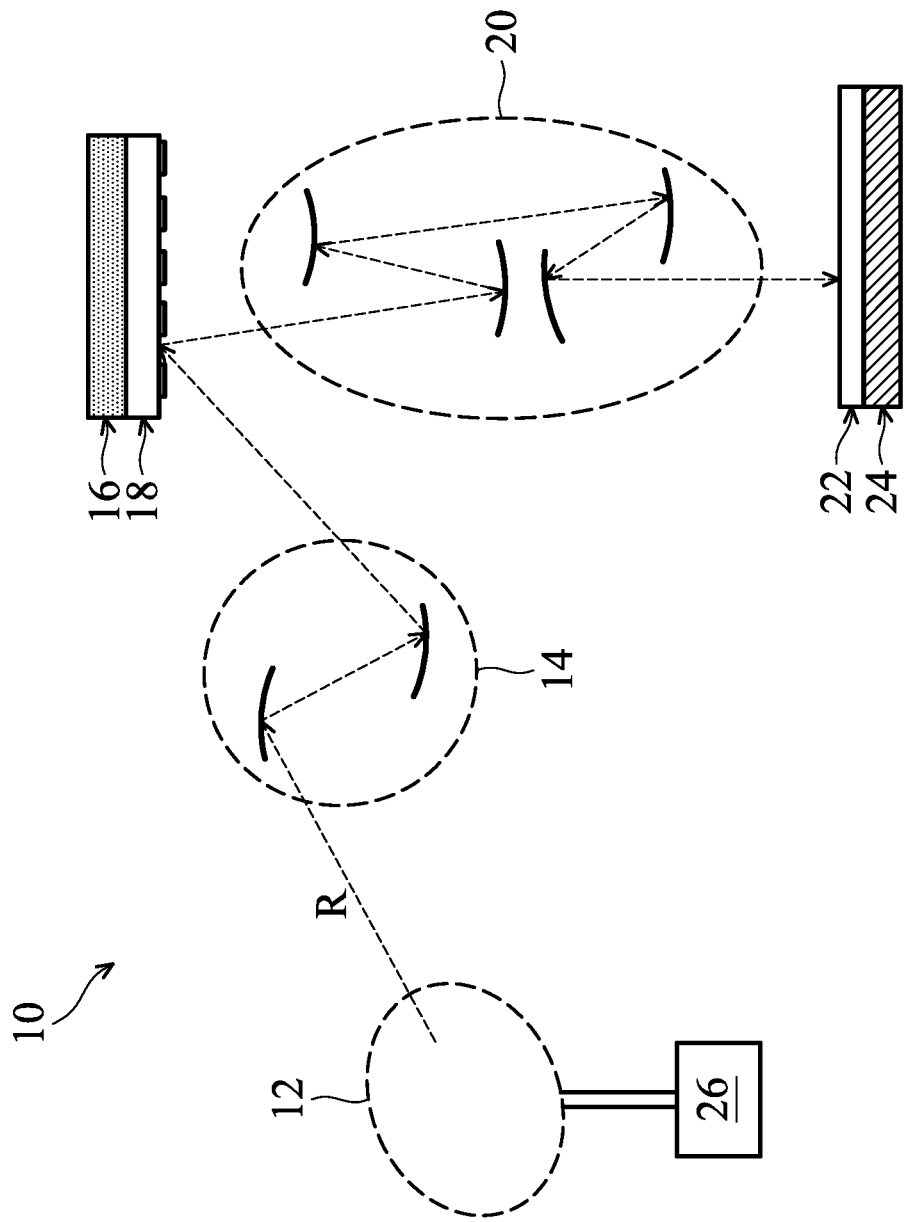
FIG. 1 shows a schematic view of a lithography system with a radiation source module, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The present disclosure is generally related to a particle removal system and particle removal methods. More particularly, it is related to system and methods for effectively removing particles from the backside of a reticle, so that the wafer throughput of EUV lithography process using this reticle is not impacted. One challenge in existing particle removal systems is low efficiency and the fact that they take too much time. An object of the present disclosure is to minimize the time required for the process to remove particles, thereby improving the wafer throughput of the EUV lithography process. Another challenge is that the property of the backside of the reticle may change be affected by the acidic solution. Accordingly, another object of the present disclosure is to minimize the area of the backside dealt with by the particle removal system.

FIG. 1 is a schematic and diagrammatic view of a lithography system 10, in accordance with some embodiments. The lithography system 10 may also be generically referred to as a scanner that is operable to perform lithography exposing processes with a respective radiation source and exposure mode.

The lithography system 10 includes a radiation source module 12, an illuminator 14, a mask stage 16, a reticle 18, a projection optics module (or projection optics box (POB)) 20 and a wafer stage 24, in accordance with some embodiments. The elements of the lithography system 10 can be added to or omitted, and the invention should not be limited by the embodiment.

The radiation source module 12 is configured to generate radians having a wavelength ranging between about 1 nm and about 100 nm. In one particular example, the radiation source module 12 generates an EUV light with a wavelength centered at about 13.5 nm. Accordingly, the radiation source module 12 is also referred to as an EUV light source. However, it should be appreciated that the radiation source module 12 should not be limited to emitting EUV light. The radiation source module 12 can be utilized to perform any high-intensity photon emission from excited target material.

In various embodiments, the illuminator 14 includes various optical modules, such as a single lens or a lens system having multiple lenses (zone plates) or alternatively reflective optics (for EUV lithography system), such as a single mirror or a mirror system having multiple mirrors in order to direct light from the radiation source module 12 onto a mask stage 16, particularly to a reticle 18 secured on the mask stage 16. In the present embodiment where the radiation source module 12 generates light in the EUV wavelength range, reflective optics is employed.

The mask stage 16 is configured to secure the reticle 18. In some embodiments, the mask stage 16 includes an electrostatic chuck (e-chuck) to secure the reticle 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the reticle 18 is a reflective reticle. One exemplary structure of the reticle 18 includes a substrate with a suitable material, such as a low thermal expansion material (LTEM) or fused quartz. In various examples, the LTEM includes TiO$_2$ doped SiO$_2$, or other suitable materials with low thermal expansion. The reticle 18 includes a reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The reticle 18 may further include a capping layer, such as ruthenium (Ru), disposed on the reflective multilayer for protection. The reticle 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift reticle.

The projection optics module (or projection optics box (POB)) 20 is configured for imaging the pattern of the reticle 18 on to a semiconductor wafer 22 secured on a wafer stage 24 of the lithography system 10. In some embodiments, the POB 20 has refractive optics (such as for a UV lithography system) or alternatively reflective optics (such as for an EUV lithography system) in various embodiments. The light directed from the reticle 18, carrying the image of the pattern defined on the reticle, is collected by the POB 20. The illuminator 14 and the POB 20 are collectively referred to as an optical module of the lithography system 10.

In the present embodiment, the semiconductor wafer 22 may be made of silicon or another semiconductor material. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source module 12. The hydrogen gas helps reduce contamination in the radiation source module 12.

Figure 2:
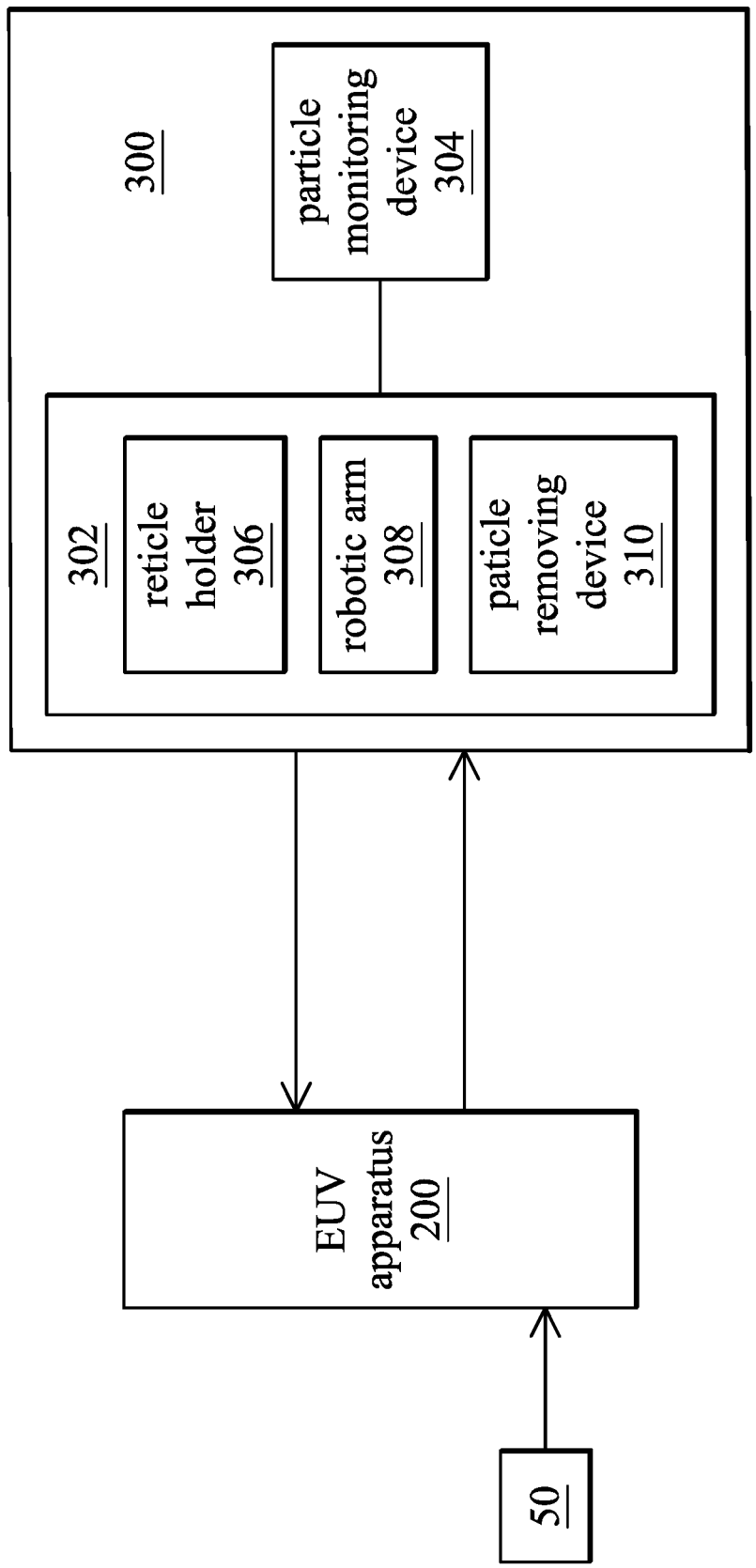
FIG. 2 shows a block diagram of a EUV apparatus and a particle removal system according to some embodiments of the present disclosure.

Please refer to FIG. 2, which shows a block diagram of a EUV apparatus 200 and a particle removal system 300 according to some embodiments of the present disclosure. In FIG. 2, the EUV apparatus 200 is similar to the lithography system 10 in FIG. 1, and one or more reticles, such as the reticle 18 in FIG. 1 or the reticle 50 in FIG. 2, are transported into the EUV apparatus 200 to perform the EUV process. In some embodiments, different reticles are utilized for forming different layer on a wafer (such as the semiconductor wafer 22) during the EUV process. However, one or more particles may be fallen on a backside of the reticle, such as the reticle 50, and when the reticle having particles on its backside is installed on the reticle stage (such as the mask stage 16), the reticle may be tilted due to the particles, resulting in defects on the semiconductor wafer 22. For preventing the overlay shift on the semiconductor wafer 22, the particle removal system 300 is provided to remove the particles. In some embodiments, the particle removal system 300 can be integrated into the EUV apparatus 200.

As shown in FIG. 2, the particle removal system 300 is provided and configured to receive a reticle having particles on its backside, and particle removal system 300 is configured to remove the particles. In some embodiments, the particle removal system 300 includes a particle removal apparatus 302 and a particle monitoring device 304. Furthermore, the particle removal apparatus 302 includes a reticle holder 306, a robotic arm 308 and a particle removal device 310. The reticle holder 306 is configured to hold a reticle, and the particle removal device 310 disposed on the robotic arm 308. The particle monitoring device 304 is configured to monitor positions and heights of the particles on the backside of the reticle, so as to obtain information about the positions and heights of the particles. In addition, the particle monitoring device 304 is configured to control the robotic arm 308 and the particle removal device 310 to align with one of the particles to be removed, and then a particle removal process is performed.

Figure 3:
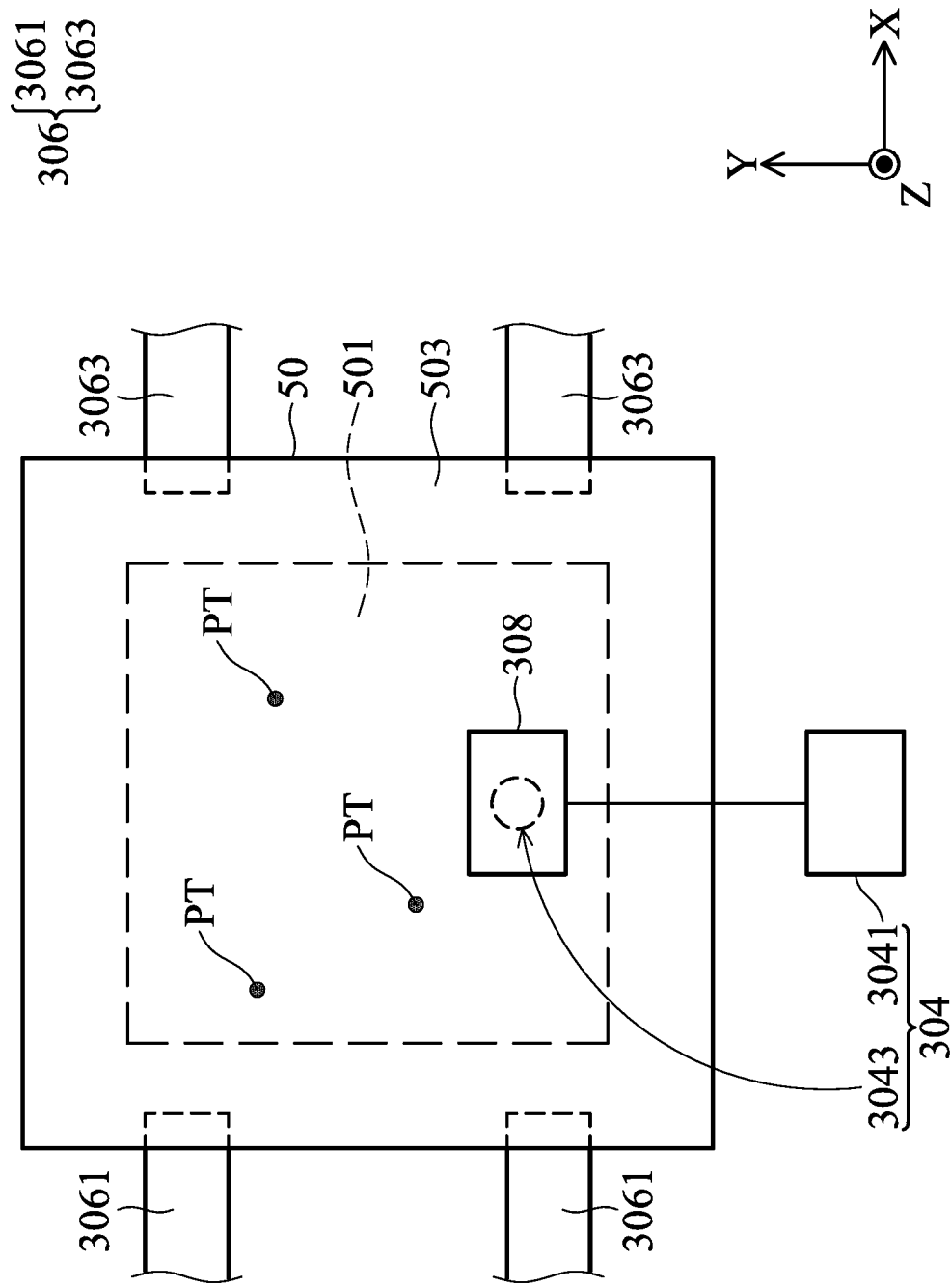
FIG. 3 shows a top view of the reticle and the reticle holder according to some embodiments of the present disclosure.

Please refer to FIG. 3, which shows a top view of the reticle 50 and the reticle holder 306 according to some embodiments of the present disclosure. As shown in FIG. 3, the reticle holder 306 includes two supporting plates 3061 and two supporting plates 3063. The reticle 50 has a rectangular structure, the two supporting plates 3061 are disposed below the left side of the reticle 50, and the supporting plates 3063 are disposed below the right side of the reticle 50, to support the reticle 50. It should be noted that the reticle 50 has a pattern area 501, and the pattern area 501 does not overlap the supporting plates 3061 and the supporting plates 3063 when viewed along the Z-axis.

In this embodiment, the reticle 50 includes a backside 503, and the backside 503 is substantially parallel to the XY plane. In addition, as shown in FIG. 3, the particle monitoring device 304 can include a controller 3041 and an optical camera module 3043. The controller 3041 may be a computer system. In one example, the computer system includes a processor and a system memory component. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor. For example, the system memory component may store information about the positions and heights of the particles.

As shown in FIG. 3, the optical camera module 3043 is installed on the robotic arm 308 and is configured to capture images related to the backside 503 and particles PT. After the reticle 50 is securely fixed by the reticle holder 306, the particle monitoring device 304 can control the robotic arm 308 to be positioned above the backside 503 of the reticle 50 so as to move along the XY plane. As a result, the controller 3041 can obtain information about the positions and heights of the particles PT according to the images captured by the optical camera module 3043, and therefore store the information in the above mentioned system memory component. It should be noted that the particle removal device 310 can further include other module for obtaining the positions and heights of the particles PT. For example, the particle removal device 310 can further include an optical scanner for constructing a 3D structure of the particles PT.

Figure 4:
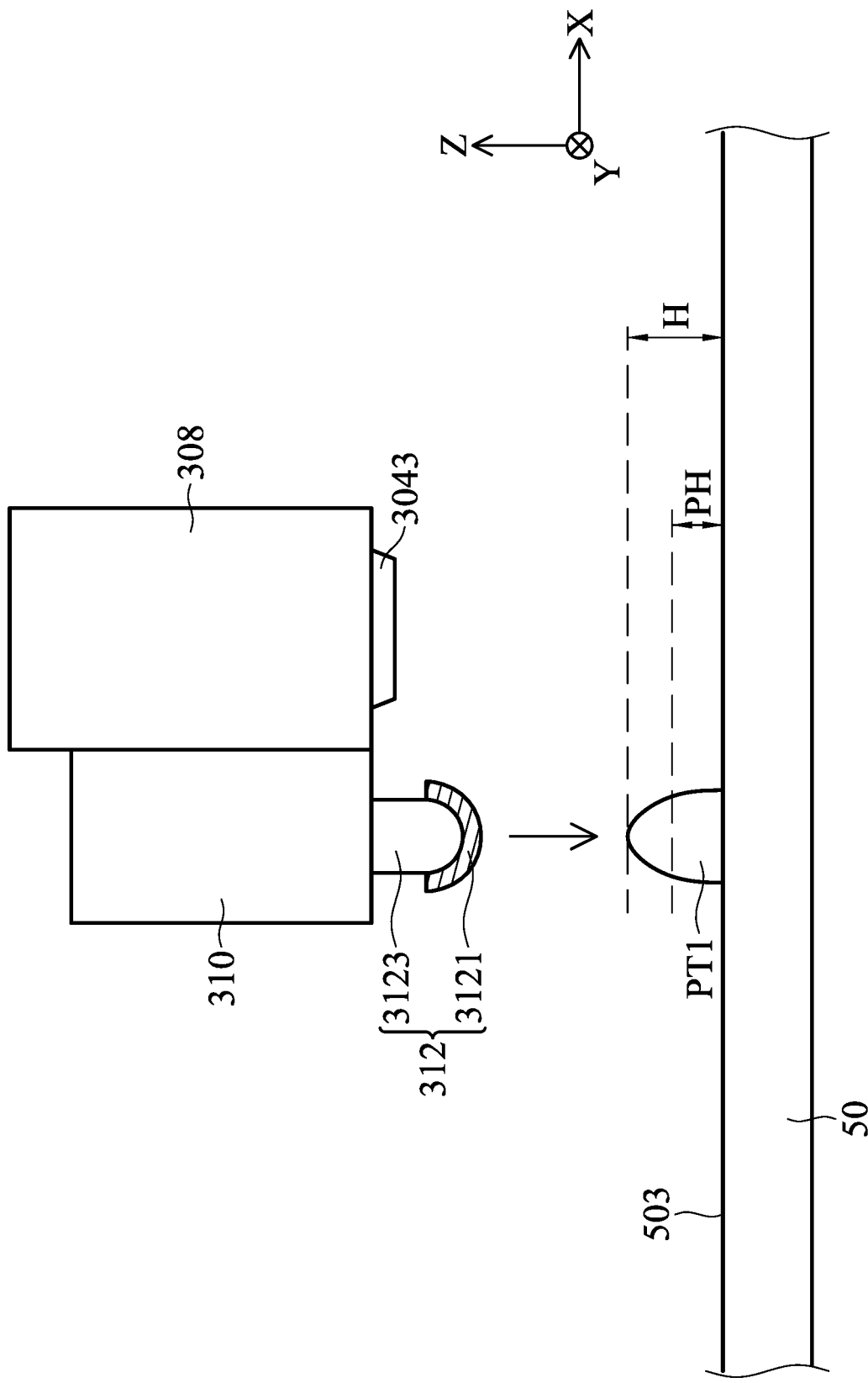
FIG. 4 shows a side view of the reticle, the robotic arm and the particle removal device according to some embodiments of the present disclosure.

Please refer to FIG. 4, which shows a side view of the reticle 50, the robotic arm 308 and the particle removal device 310 according to some embodiments of the present disclosure. In this embodiment, the particle monitoring device 304 obtains information about the position and height of one particle PT1 in FIG. 4. For example, information about the particle PT1 has a coordinate and a height H, and the particle monitoring device 304 controls the robotic arm 308 and the particle removal device 310 to align with the particle PT1 according to the coordinate. Furthermore, the particle removal device 310 can include a grinding module 312, and the grinding module 312 includes a grinding tape 3121 and a grinding head 3123.

When the particle monitoring device 304 determines that the height H is greater than a predetermined height PH, such as 3 μm, the particle monitoring device 304 is configured to control the grinding head 3123 to force the grinding tape 3121 downward (along the −Z-axis direction), so as to grind the particle PT1 until the height of the particle PT1 reach the predetermined height PH. In this embodiment, the grinding tape 3121 is made of a hard material. For example, the grinding tape 3121 is made of zinc oxide, but it is not limited thereto.

Figure 5:
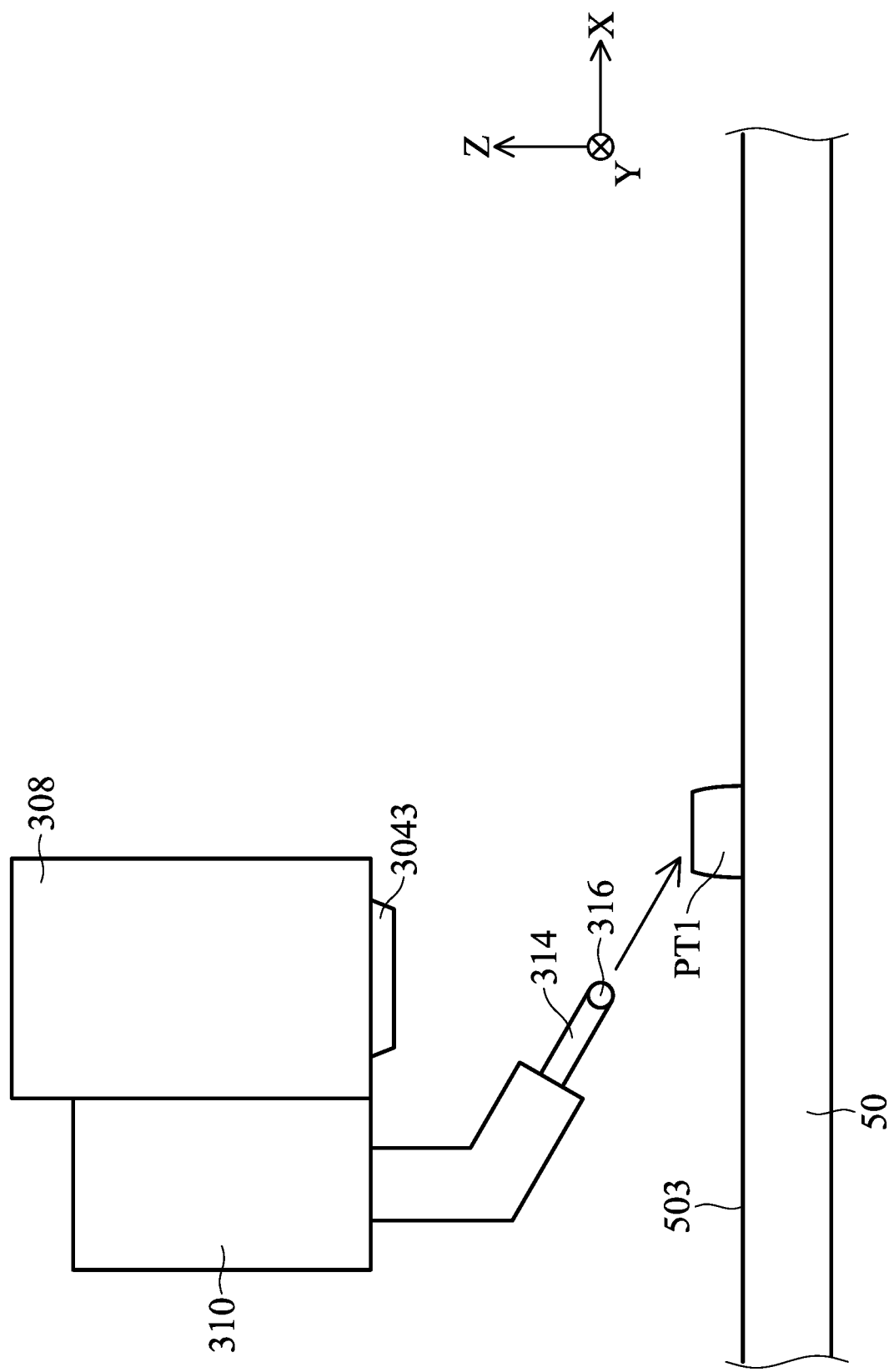
FIG. 5 shows a side view of the particle in FIG. 4 after being ground by the grinding module according to the embodiment of the present disclosure.

Please refer to FIG. 5, which shows a side view of the particle PT1 in FIG. 4 after being ground by the grinding module 312 according to the embodiment of the present disclosure. As shown in FIG. 5, the height of the particle PT1 reaches the predetermined height PH (3 μm). In addition, the particle removal device 310 can further include a rod member 314 which is disposed on the robotic arm 308, and a polymer 316 is disposed on a front end of the rod member 314. As shown in FIG. 5, the robotic arm 308 is configured to drive the rod member 314 to move along an arrow direction (an arrow illustrated in FIG. 5), so as to stick the particle PT1 from the backside 503. In some embodiments, the angle formed between the rod member 314 (the arrow direction) and the backside 503 is within a range of 10 to 90 degrees, but it is not limited thereto.

In some circumstances, some particles are fixedly stuck to the backside 503 and therefore they are hard to be removed by the rod member 314 and the polymer 316. The kind of particles can be determined by the particle monitoring device 304. For example, the particle monitoring device 304 can determine whether a particle is a sticky particle (i.e., hard to be removed by the rod member 314) according to variation of the height of a particle. For example, if one particle is stuck by the rod member 314 and its height does not change, the particle monitoring device 304 determines that the particle is a sticky particle. On the other hand, if one particle is stuck by the rod member 314 and then its height decreases, the particle monitoring device 304 determines that the particle is not a sticky particle. To remove this kind of sticky particle, another module of the particle removal device 310 is needed.

Figure 6A:
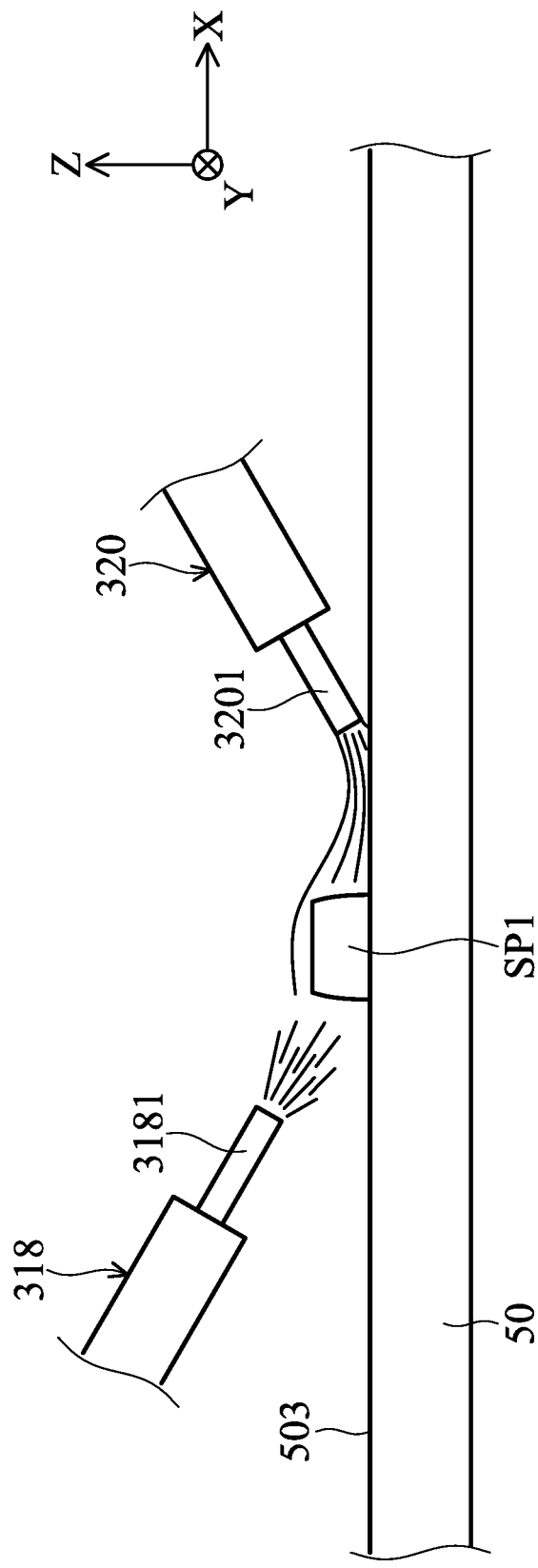
FIG. 6A shows a diagram of a solution spraying module and a sucking module of the particle removal device according to some embodiments of the present disclosure.

Please refer to FIG. 6A, which shows a solution spraying module 318 and a sucking module 320 of the particle removal device 310 according to some embodiments of the present disclosure. As shown in FIG. 6A, the solution spraying module 318 is configured to spray a solution onto a sticky particle SP1 to remove the sticky particle SP1. In this embodiment, the solution spraying module 318 can include a spray nozzle 3181, and the solution spraying module 318 is configured to spray an acidic solution and/or water through the spray nozzle 3181 to the sticky particle SP1.

For example, if the sticky particle SP1 can be dissolved in the acidic solution, such as sulfuric acids, the solution spraying module 318 can provide sulfuric acids to dissolve the sticky particle SP1, so as to achieve the purpose of removing the sticky particle SP1. After the sticky particle SP1 is totally dissolved, the solution spraying module 318 can further spray water through the spray nozzle 3181 to clean the backside 503 of the reticle 50. It should be noted that the solution or liquid provided by the solution spraying module 318 is not limited to this embodiment.

As shown in FIG. 6A, the particle removal device 310 can further include the sucking module 320 configured to suck the solution with the sticky particle SP1 being removed. When the spray nozzle 3181 sprays the solution to the sticky particle SP1, the sticky particle SP1 is gradually dissolved in the solution, and then is sucked by the sucking module 320. In this embodiment, the sucking module 320 includes a sucking nozzle 3201, and the sucking nozzle 3201 is close to the backside 503 for effectively sucking the solution.

In this embodiment, an angle between the spray nozzle 3181 of the solution spraying module 318 and the backside 503 of the reticle 50 is greater than 10 degrees and less than 90 degrees. In addition, the angle between the sucking nozzle 3201 of the sucking module 320 and the backside 503 is within a range of 30 to 45 degrees in this embodiment, but it is not limited thereto. For example, the angle may be greater than 10 degrees and less than 90 degrees in other embodiments.

Figure 6B:
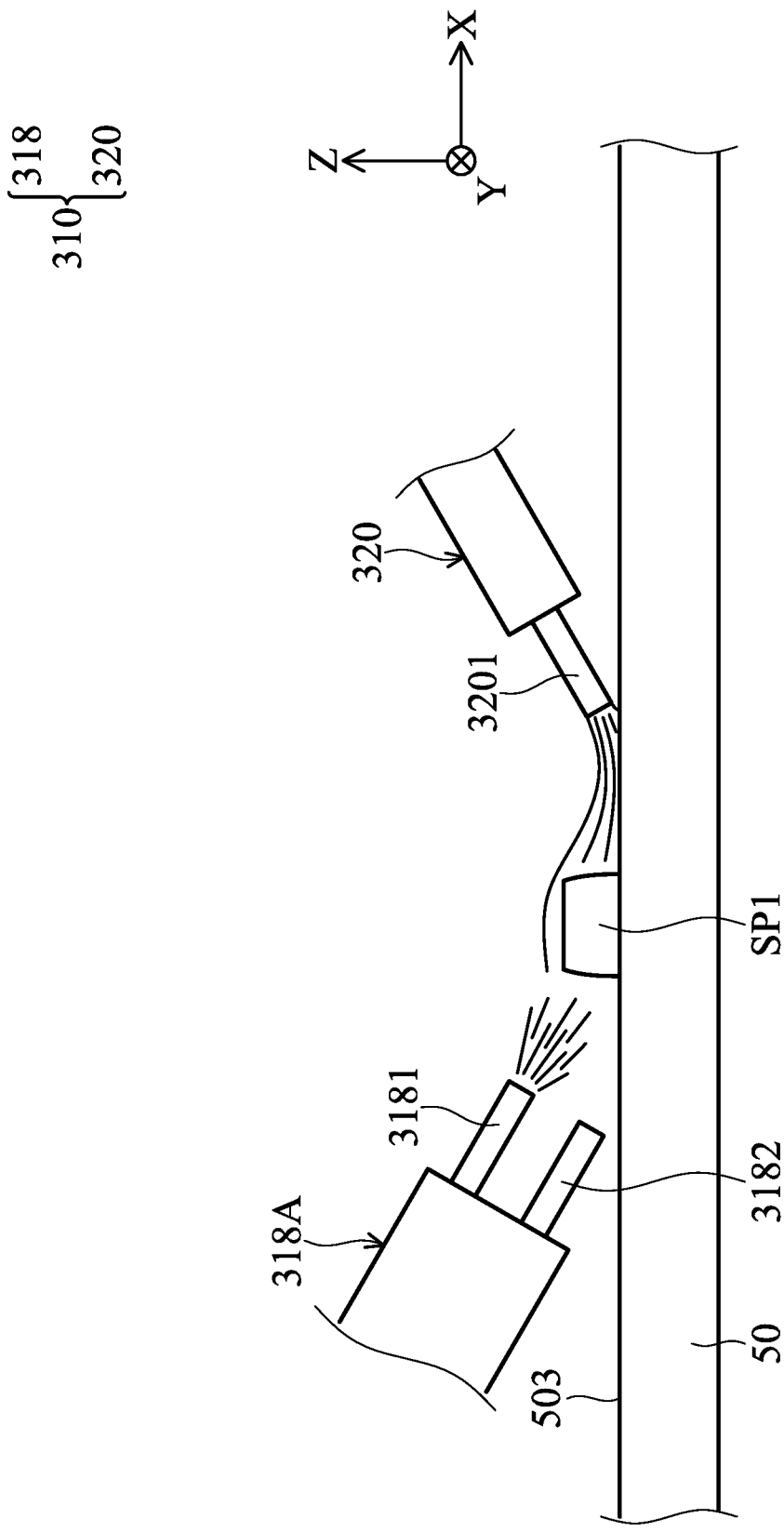
FIG. 6B shows a diagram of a solution spraying module and a sucking module of the particle removal device according to some embodiments of the present disclosure.

Please refer to FIG. 6B, which shows a solution spraying module 318A and a sucking module 320 of the particle removal device 310 according to some embodiments of the present disclosure. In this embodiment, the solution spraying module 318A can further include another spray nozzle 3182. The spray nozzle 3181 is configured to spray the acidic solution, and the spray nozzle 3182 is configured to spray water.

Figure 7:
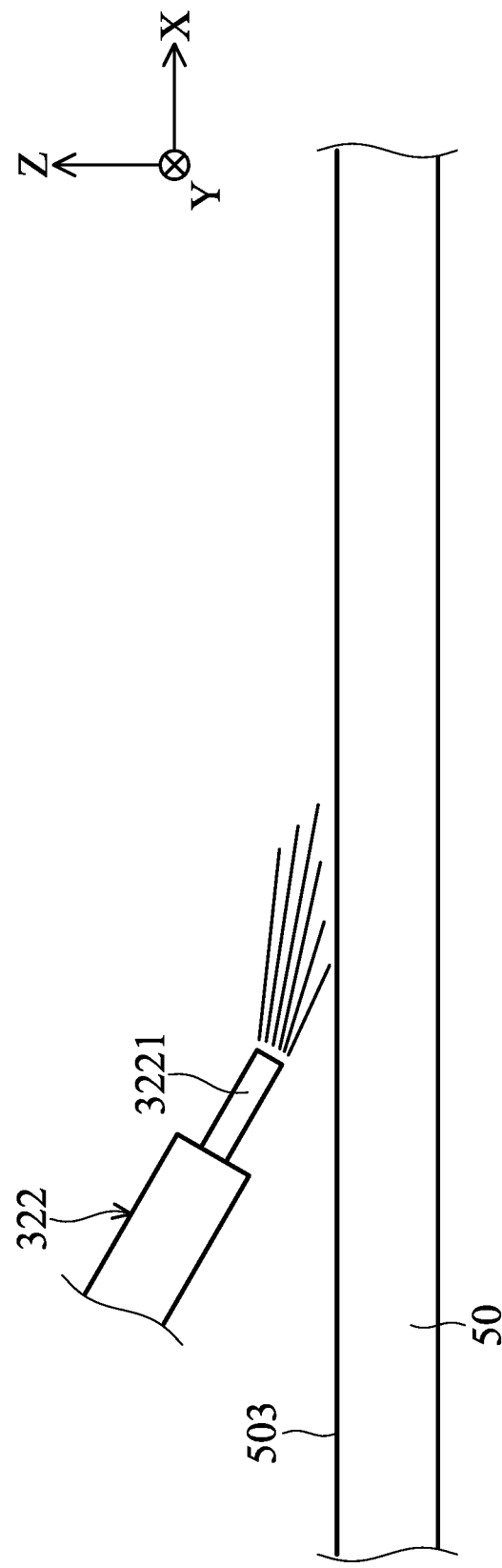
FIG. 7 shows a diagram of a gas emitting module of the particle removal device according to some embodiments of the present disclosure.

Please refer to FIG. 7, which shows a gas emitting module 322 of the particle removal device 310 according to some embodiments of the present disclosure. As shown in FIG. 7, the particle removal device 310 further includes the gas emitting module 322, and the gas emitting module 322 is configured to emit a gas onto the backside 503 of the reticle 50. In this embodiment, the gas emitting module 322 includes a spray nozzle 3221 for spraying a gas to dry the backside 503. The gas provided by the gas emitting module 322 can be nitrogen gas, but not limited thereto. The gas emitting module 322 can provide other noble gases in other embodiments.

Based on the design of the particle removal device 310 of the present disclosure, the sticky particles that are difficult to remove on the backside 503 can be easily removed by acidic solution and/or water. Therefore, the reticle 50 does not need to be entirely soaked an acidic solution and then using ultrasonic waves for removing the sticky particles on the backside 503. That is, the time required for the process of removing the sticky particle using the particle removal device 310 of the present disclosure can be greatly reduced. For example, the time of process for removing the sticky particles can be reduced from 52 hours to 2 hours using the particle removal device 310. Moreover, the possibility of damaging the pattern (such as pattern area 501) of a frontside of the reticle can be reduced.

In addition, if the backside 503 is exposed to an acidic solution, the property of the backside 503 maybe affected. Therefore, it is also desirable to reduce the area of the backside 503 exposed to acidic solutions.

Figure 8:
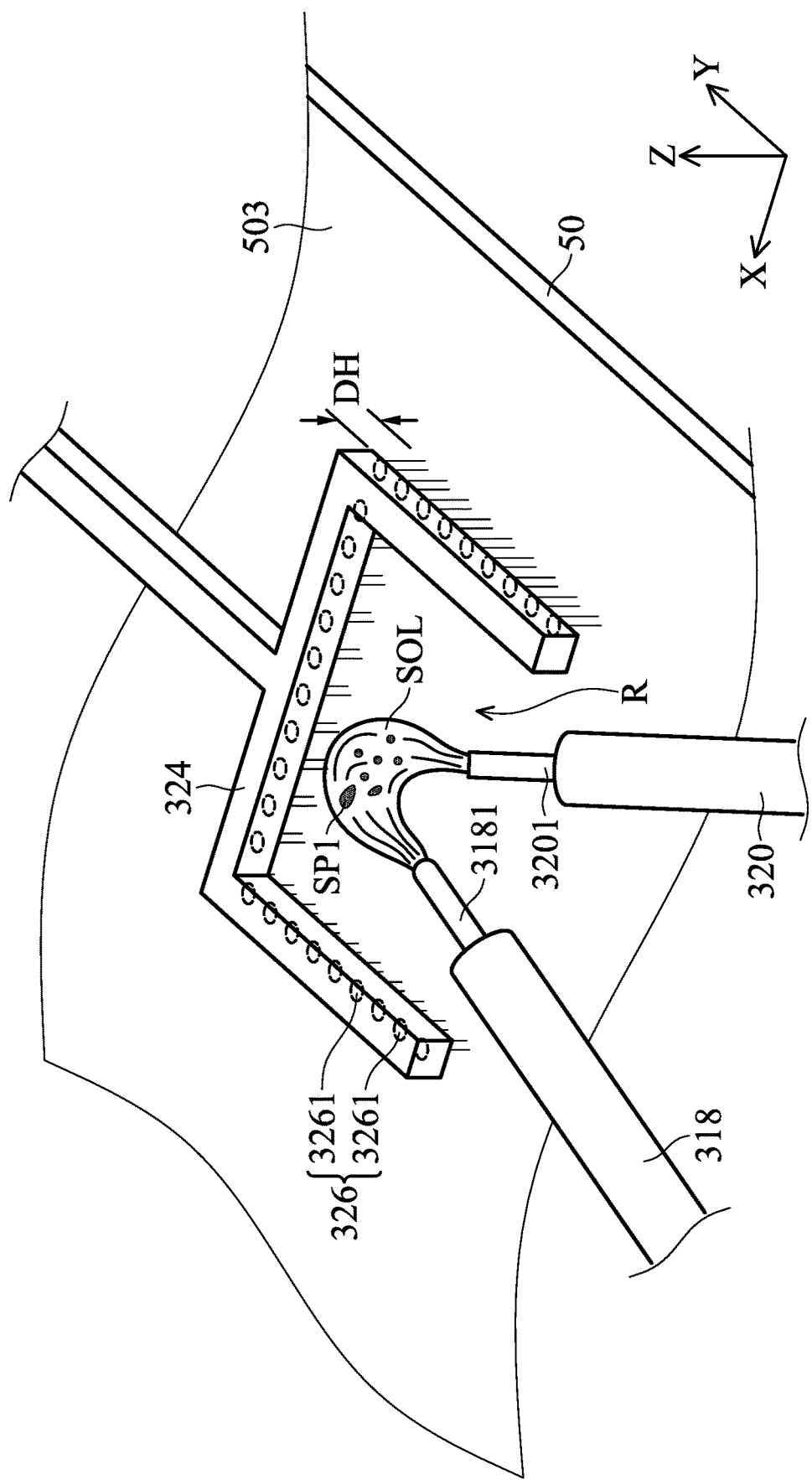
FIG. 8 shows a schematic diagram of the particle removal device disposed above the reticle according to some embodiments of the present disclosure.

Please refer to FIG. 8, which shows a schematic diagram of the particle removal device 310 disposed above the reticle 50 according to some embodiments of the present disclosure. In this embodiment, the particle removal device 310 further includes a baffle 324 configured to be disposed over the backside 503 of the reticle 50 so as to define a range that encompasses one of the particles to be removed. For example, as shown in FIG. 8, the baffle 324 includes a U-shaped structure and defines a range R to encompass the sticky particle SP1, but it is not limited thereto. For example, the baffle 324 can also include a ring structure, a frame structure and a horseshoe-shaped structure.

It should be noted that the baffle 324 is not in contact with the backside 503, and a distance DH is formed between the baffle 324 and the backside 503 of the reticle 50. In this embodiment, the distance DH is within a range of 1 to 5 μm, but it is not limited thereto.

In addition, in this embodiment, the baffle 324 can include an air emitting module 326, and the air emitting module 326 is disposed on an outer side of a bottom of the baffle 324. For example, as shown in FIG. 8, the air emitting module 326 can include a plurality of air emitting holes 3261 disposed on the outer side of the bottom of the baffle 324. The air emitting module 326 is coupled to the controller 3041 in FIG. 3, and the controller 3041 controls the air emitting module 326 to emit air or a noble gas, such as nitrogen, so as to form an air curtain toward the backside 503. The shape of the air curtain corresponds to the shape of the baffle 324. In other embodiments, the air emitting holes 3261 of the air emitting module 326 can be integrated as a single groove for emitting air or gas.

As shown in FIG. 8, when the controller 3041 of the particle monitoring device 304 controls the solution spraying module 318 and the sucking module 320 to perform the removal process, the solution spraying module 318 sprays the solution SOL to the sticky particle SP1 through the spray nozzle 3181, and the sticky particle SP1 is gradually dissolved in the solution SOL, and then is sucked by the sucking module 320 through the sucking nozzle 3201.

It should be noted that the baffle 324 has the U-shaped structure which forms an opening, and the solution spraying module 318 and the sucking module 320 are disposed on the same side of the opening, as shown in FIG. 8. Moreover, because the air emitting module 326 forms the air curtain to encompass the range R, the solution SOL emitted from the solution spraying module 318 is constrained by the air curtain within the range R until it is sucked by the sucking module 320 through the sucking nozzle 3201. That is, based on the structural design of the baffle 324 in this embodiment, the solution SOL does not flow out of the range R, so as to minimize the area of the backside 503 exposed to the solution SOL.

Figure 9:
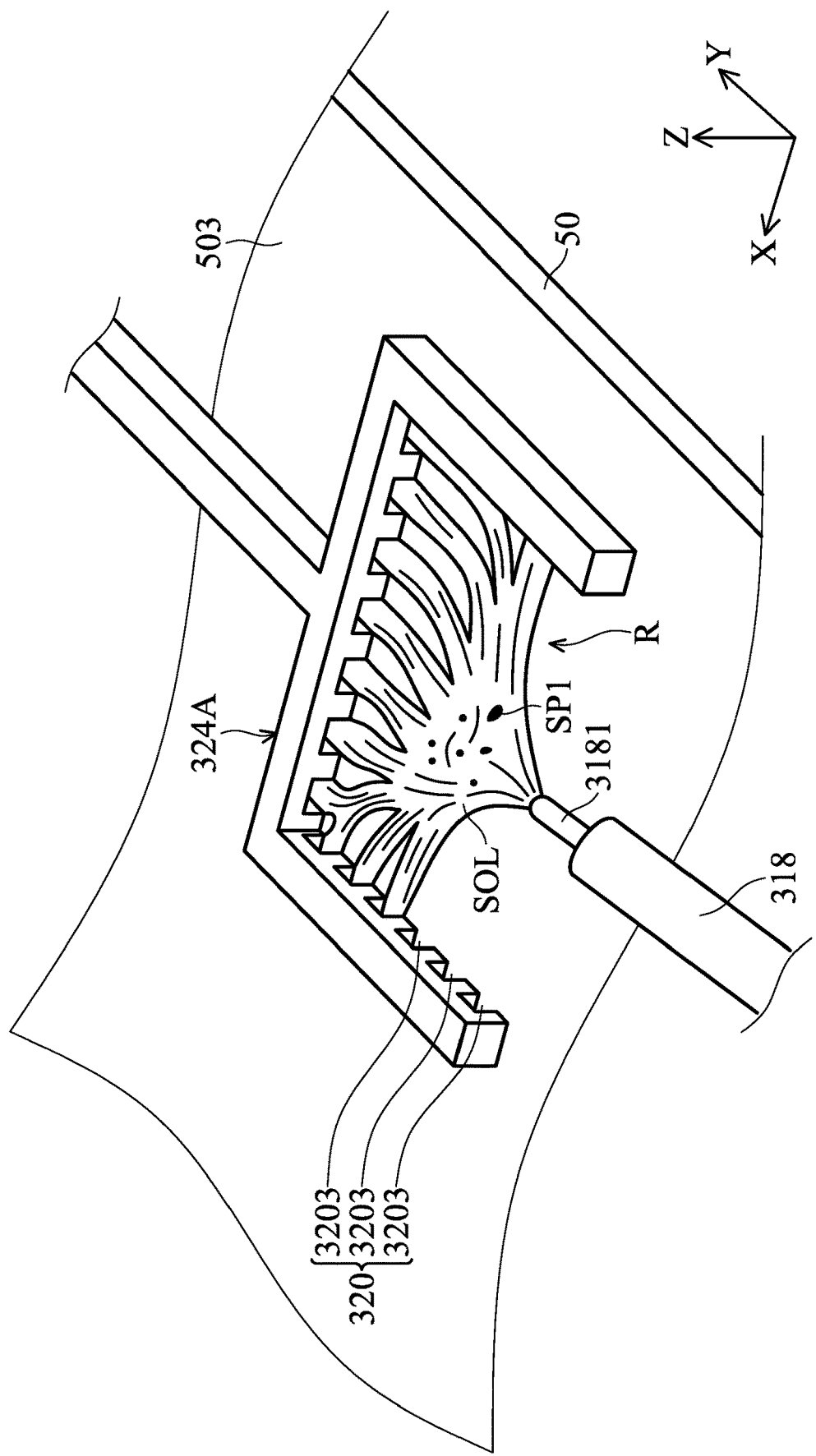
FIG. 9 shows a schematic diagram of a baffle and the solution spraying module disposed above the reticle according to another embodiment of the present disclosure.

Please refer to FIG. 9, which shows a schematic diagram of a baffle 324A and the solution spraying module 318 disposed above the reticle 50 according to another embodiment of the present disclosure. As shown in FIG. 9, in this embodiment, the baffle 324A has a U-shaped structure, and the sucking module 320 is integrally formed on the inner side of the bottom of the baffle 324A. As shown in FIG. 9, the sucking module 320 includes a plurality of sucking holes 3203 disposed on the inner side of the bottom of the baffle 324A, and the arrangement of the sucking holes 3203 corresponds to the shape of the baffle 324A.

When the controller 3041 of the particle monitoring device 304 controls the solution spraying module 318 to perform the removal process, the solution spraying module 318 sprays the solution SOL to the sticky particle SP1 through the spray nozzle 3181, and the sticky particle SP1 is gradually dissolved in the solution SOL. Then, the solution SOL is sucked by the sucking module 320 through the sucking holes 3203. Because the arrangement of the sucking holes 3203 encompasses the range R, the solution SOL emitted from the solution spraying module 318 is constrained within the range R until it is sucked by the sucking module 320 through the sucking holes 3203. That is, based on the structural design of the baffle 324A in this embodiment, the solution SOL does not flow out of the range R, so as to minimize the area of the backside 503 exposed to the solution SOL.

Figure 10:
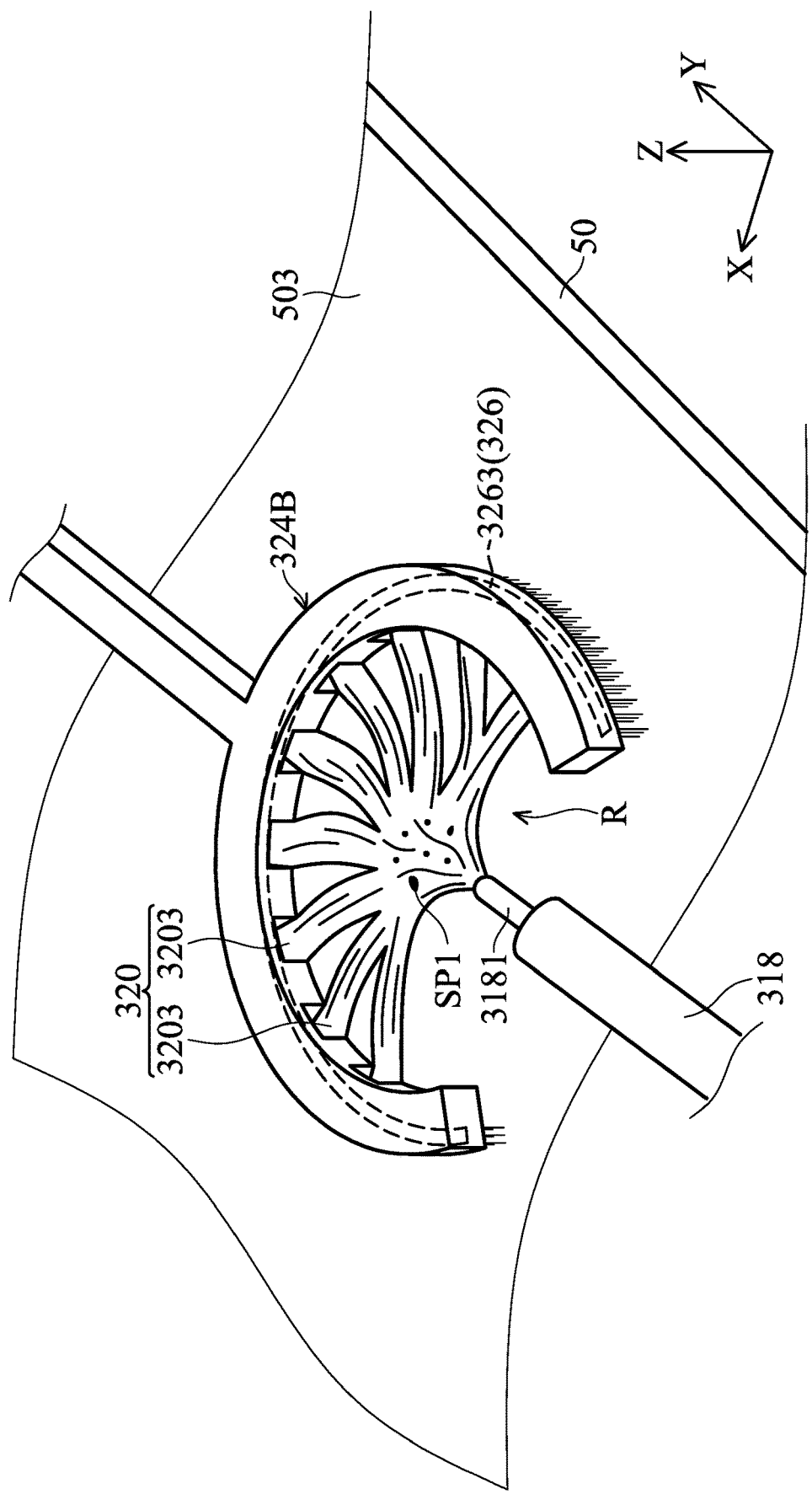
FIG. 10, which shows a schematic diagram of a baffle and the solution spraying module disposed above the reticle according to another embodiment of the present disclosure.

Please refer to FIG. 10, which shows a schematic diagram of a baffle 324B and the solution spraying module 318 disposed above the reticle 50 according to another embodiment of the present disclosure. In this embodiment, the baffle 324B has a horseshoe-shaped structure, and the air emitting module 326 and the sucking module 320 are both integrated in the baffle 324B.

As shown in FIG. 10, the sucking module 320 includes a plurality of sucking holes 3203 disposed on the inner side of the bottom of the baffle 324B, and the arrangement of the sucking holes 3203 corresponds to the shape of the baffle 324B. In addition, in this embodiment, the air emitting module 326 includes a long curved air-emitting groove 3263 disposed on the outer side of the bottom of the baffle 324B for providing the air curtain, and the shape of the air-emitting groove 3263 corresponds to that of the baffle 324B.

Because the arrangement of the sucking holes 3203 and the air-emitting groove 3263 encompasses the range R, the solution SOL emitted from the solution spraying module 318 is constrained within the range R until it is sucked by the sucking module 320 through the sucking holes 3203. That is, based on the structural design of the baffle 324B in this embodiment, it can be ensured that the solution SOL does not flow out of the range R, so as to minimize the area of the backside 503 exposed to the solution SOL.

It should be noted that the shape of the baffle is not limited to above embodiments. For example, the baffle can also be an enclosed frame structure or an enclosed ring structure in other embodiments. When the baffle is the enclosed frame structure, the side length of the frame structure can be 1 centimeter. When the baffle is the enclosed ring structure, the diameter of the frame structure can be 1 centimeter. The size of the baffle is not limited to these embodiments, and it depends on practical design requirement.

Figure 11A:
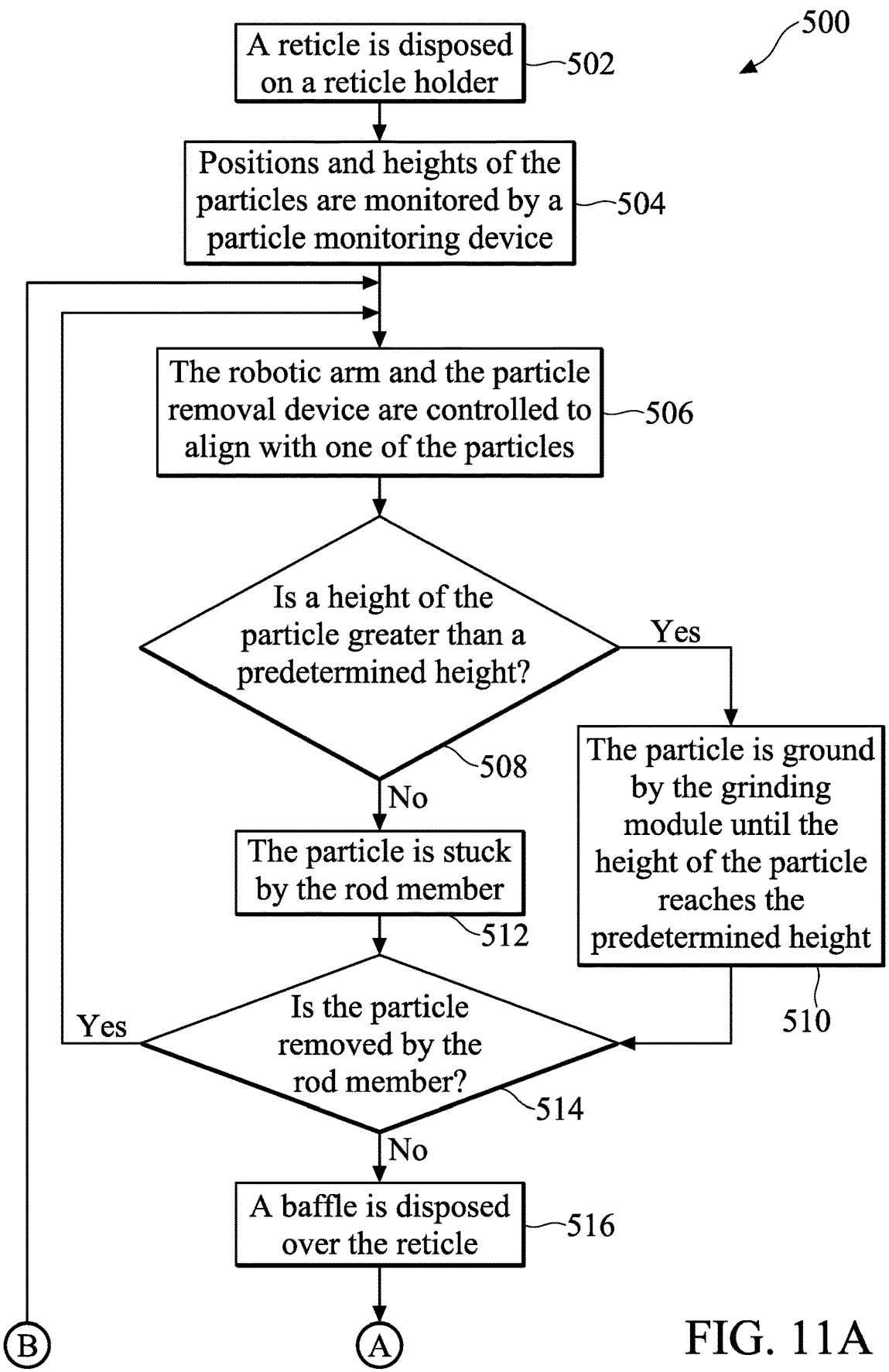
FIG. 11A and FIG. 11B are a flowchart of a particle removal method for removing particles on a backside of a reticle according to some embodiments of the present disclosure.
Figure 11B:
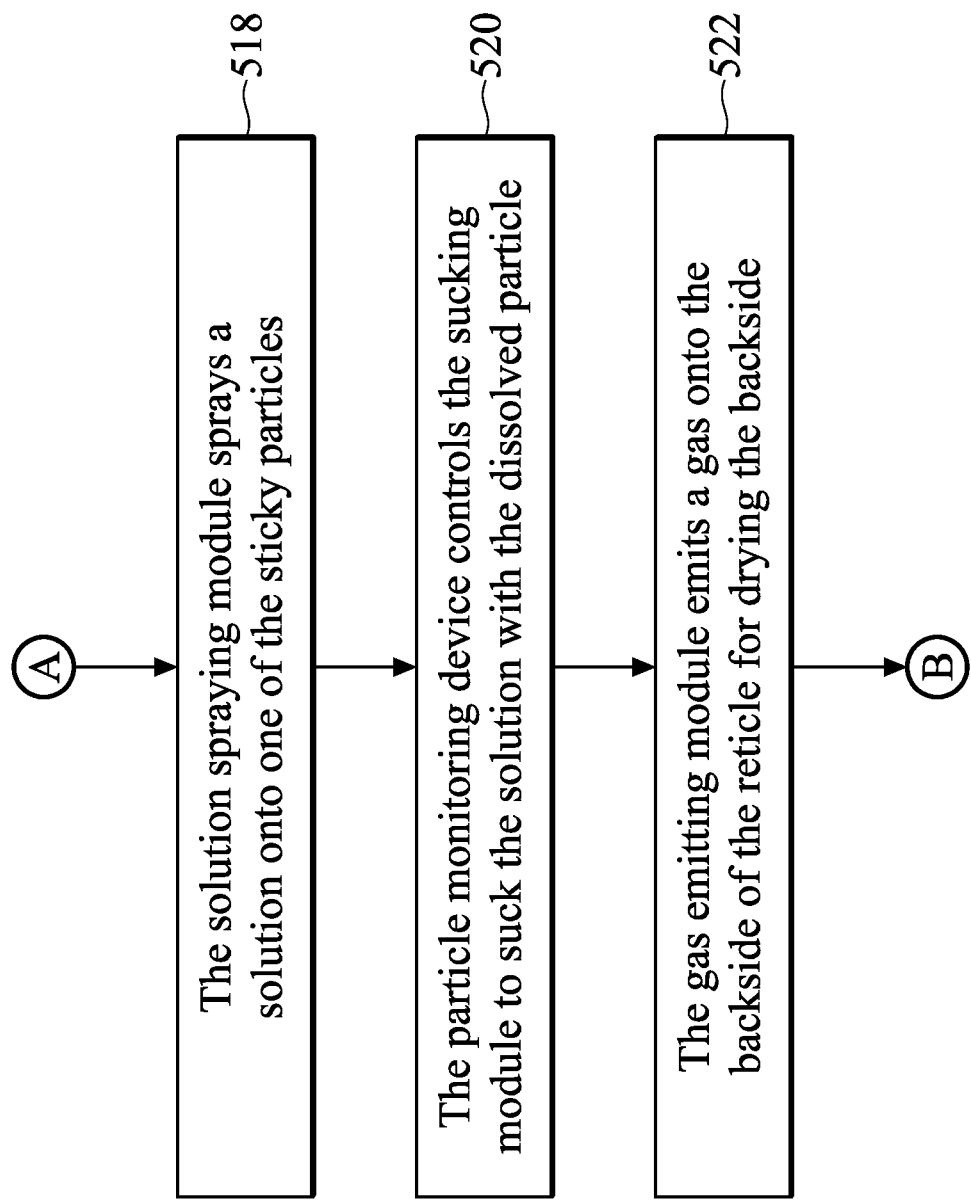

FIG. 11A and FIG. 11B are a flowchart of a particle removal method 500 for removing particles on the backside of a reticle according to some embodiments of the present disclosure. The method 500 includes operation 502, in which a reticle is disposed on a reticle holder. For example, the reticle 50 is disposed on the reticle holder 306 and is fixed, as shown in FIG. 3.

The method 500 also includes operation 504 in which the positions and heights of the particles are monitored by a particle monitoring device, so as to obtain information about the positions and heights of the particles. For example, as shown in FIG. 3, the controller 3041 of the particle monitoring device 304 can obtain the information about the positions and heights of the particles PT according to the images captured by the optical camera module 3043, and therefore store the information in the above mentioned system memory component.

The method 500 also includes operation 506 in which the robotic arm 308 and the particle removal device 310 are controlled to align with one of the particles according to the information. As shown in FIG. 4, the particle PT1 is required to be removed, and the robotic arm 308 and the particle removal device 310 are controlled by the particle monitoring device 304 to align with the particle PT1.

In addition, the method 500 also includes operation 508 in which the particle monitoring device 304 determines whether a height of the particle to be removed is greater than a predetermined height. For example, as shown in FIG. 4, if the height H of the particle PT1 is greater than the predetermined height PH, operation 510 is performed. However, if the height H of the particle PT1 is not greater than the predetermined height PH, operation 512 is performed.

In operation 510, in response to the height H of the particle PT1 being greater than the predetermined height PH, the particle PT1 is ground by the grinding module 312 until the height H of the particle PT1 reaches the predetermined height PH, such as 3 μm. After the height H of the particle PT1 reaches the predetermined height PH, operation 512 is subsequently performed.

In operation 512, as shown in FIG. 5, after the particle PT1 is ground to the predetermined height PH, the particle PT1 is subsequently stuck by the rod member 314. The robotic arm 308 is configured to drive the rod member 314 to move along the arrow direction illustrated in FIG. 5, so as to stick the particle PT1 from the backside 503. In some embodiments, the angle formed between the arrow direction and the backside 503 is within a range of 10 to 90 degrees.

The method 500 also includes operation 514 in which the particle monitoring device 304 determines whether the particle PT1 is removed by the rod member 314. For example, the particle monitoring device 304 can monitor whether the height of the particle PT1 is decreased or not. If the height of the particle PT1 is decreased, the particle monitoring device 304 determines that the particle PT1 can be removed by the rod member 314, and method 500 goes back to operation 506. On the other hand, if the height of the particle PT1 is not decreased, the particle monitoring device 304 determines that the particle PT1 cannot be removed by the rod member 314 so that the particle PT1 is a sticky particle, and then operation 516 is subsequently performed.

The method 500 also includes operation 516 in which a baffle is disposed over the reticle. For example, as shown in FIG. 8, the baffle 324 is disposed over the reticle 50 to define a range R encompassing the particle PT1, and a distance DH is formed between the baffle 324 and the backside 503 of the reticle 50. In some embodiments, the distance DH is within a range of 1 to 5 μm. In addition, as shown in FIG. 8, the baffle 324 can include the air emitting module 326, and the air emitting module 326 is disposed on the outer side of the bottom of the baffle 324. The air emitting module 326 is coupled to the controller 3041, and the controller 3041 controls the air emitting module 326 to emit air or a noble gas, such as nitrogen, so as to form the air curtain toward the backside 503.

The method 500 also includes operation 518 in which the solution spraying module sprays a solution onto one of the sticky particles. For example, as shown in FIG. 8, the solution spraying module 318 sprays the solution SOL to the sticky particle SP1 through the spray nozzle 3181, and then the sticky particle SP1 is gradually dissolved in the solution SOL.

The method 500 also includes operation 520 in which the controller 3041 of the particle monitoring device 304 controls the sucking module 320 to suck the solution SOL with the dissolved particle PT1, so as to remove the particle PT1. In some embodiments, as shown in FIG. 8, operation 518 and operation 520 can be performed at the same time. In some embodiments, the air emitting module 326 provides the air curtain to encompass the range R, so that the solution SOL is constrained by the air curtain within the range R until it is sucked by the sucking module 320 through the sucking nozzle 3201. Therefore, the solution SOL does not flow out of the range R, so as to minimize the area of the backside 503 exposed to the solution SOL.

The method 500 also includes operation 522 in which a gas emitting module emits a gas onto the backside of the reticle for drying the backside. For example, as shown in FIG. 7, after the sticky particle is removed, the controller 3041 controls the spray nozzle 3221 of the gas emitting module 322 to spray a gas to dry the backside 503. The gas provided by the gas emitting module 322 can be nitrogen gas or one of the noble gases.

It should be noted that some operations of method 500 can be performed together, or some operations can be omitted in some embodiments. For example, operation 516 can be omitted in some embodiments.

Embodiments of the present disclosure can provide a particle removal apparatus and methods for cleaning the backside of a reticle which is used in a EUV lithography process. Based on the design of the particle removal system of the present disclosure, the sticky particles that are difficult to remove on the backside of the reticle can be easily removed using acidic solution and water. Therefore, the reticle 50 does not need to be entirely soaked an acidic solution and then using ultrasonic waves for removing the sticky particles on the backside 503. That is, the time required for the process of removing the sticky particle using the particle removal system of the present disclosure can be greatly reduced. For example, the time of process for removing the sticky particle can be reduced from 52 hours to 2 hours using the particle removal apparatus.

In addition, the particle removal system utilizes a baffle to define a range for removing the particle, so that the solution for dissolving the particle is constrained within the range, so as to minimize the area of the backside exposed to the solution. Therefore, it can prevent too much area of the backside of the reticle from being affected. As a result, the safety of reticle can be ensured.

According to some embodiments, a particle removal apparatus is provided. The particle removal apparatus includes a reticle holder configured to hold a reticle. The particle removal apparatus further includes a robotic arm. The particle removal apparatus also includes a particle removal device disposed on the robotic arm, and the particle removal device includes a solution spraying module. In addition, the robotic arm and the particle removal device are configured to align with one of particles on a backside of the reticle, and the solution spraying module is configured to spray a solution onto the particle to remove the particle.

According to some embodiments, a particle removal system is provided. The particle removal system includes a reticle holder configured to hold a reticle, and the reticle includes a backside. The particle removal system further includes a robotic arm. The particle removal system also includes a particle monitoring device configured to monitor positions and heights of particles on the backside of the reticle to obtain information about the positions and heights of the particles. In addition, the particle removal system includes a particle removal device disposed on the robotic arm, and the particle removal device includes a solution spraying module. Furthermore, the particle monitoring device controls the robotic arm and the particle removal device to be aligned with one of the particles according to the information, and the solution spraying module is configured to spray a solution onto the one of the particles so as to remove the one of the particles.

According to some embodiments, a particle removal method for removing particles on the backside of a reticle is provided. The method includes disposing the reticle on a reticle holder. In addition, the method includes spraying, by a particle removal device, a solution onto the one of the particles. The method further includes sucking, by the particle removal device, the solution on the reticle with the one of the particles being removed. The method further includes emitting, by the particle removal device, a gas onto the backside of the reticle for drying the backside.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A particle removal apparatus, comprising:
   a reticle holder, configured to hold a reticle;
   a robotic arm, comprising a first holding arm and a second holding arm; and
   a particle removal device, disposed on the robotic arm, wherein the particle removal device comprises a solution spraying module, a sucking module, and a baffle;
   wherein the first holding arm and the particle removal device are configured to align with a particle on a backside of the reticle, and the solution spraying module is disposed on the first holding arm and is configured to spray a solution onto the particle and remove the particle,
   wherein the baffle is disposed on the second holding arm, and the baffle comprises a first section, a second section and a support section, wherein the first section and the second section have curved shapes, and the first section and the second section are connected to the support section, wherein the solution spraying module is located between the first section and the second section, wherein the baffle is configured to be disposed over the backside of the reticle, wherein the sucking module is configured to suck the solution on the reticle with the particle being removed, wherein the first section, the second section and the support section define an enclosed area that encompasses the particle to be removed, wherein the sucking module comprises a plurality of sucking holes, and the sucking holes are formed on an inner surface of the baffle, and the solution in the enclosed area is directed towards the sucking holes.

2. The particle removal apparatus of claim 1, wherein the particle removal device further comprises a gas emitting module, configured to emit a gas onto the backside of the reticle for drying the backside.

3. The particle removal apparatus of claim 1, wherein an angle between the spraying module and the backside of the reticle is greater than 10 degrees and less than 90 degrees.

4. The particle removal apparatus of claim 1, wherein the particle removal device further comprises a rod member disposed on the robotic arm, and the robotic arm drives the rod member to contact the particle.

5. The particle removal apparatus of claim 4, wherein a polymer is disposed on a front end of the rod member such that the particle is adhere to the polymer of the rod member.

6. The particle removal apparatus of claim 1, wherein the baffle comprises a horseshoe-shaped structure, and the solution spraying module faces toward the support section of the baffle.

7. The particle removal apparatus of claim 1, wherein the baffle comprises an air emitting module disposed on an outer side of a bottom of the baffle.

8. The particle removal apparatus of claim 1, wherein the sucking module is integrally formed on an inner side of the bottom of the baffle.

9. The particle removal apparatus of claim 1, wherein the baffle comprises an air emitting module, and the air emitting module comprises a plurality of air emitting holes;
wherein the baffle has a bottom surface faces the backside of the reticle, and the bottom surface is different from the inner surface,
wherein the air emitting holes are formed on the bottom surface.

10. The particle removal apparatus of claim 1, wherein the baffle comprises an air emitting module, disposed on the outer side of the bottom of the baffle, and the air emitting module comprises a long curved air-emitting groove;
wherein the sucking module is integrally formed on the inner side of the bottom of the baffle.

11. The particle removal apparatus of claim 10, wherein the long curved air-emitting groove faces the backside of the reticle.

12. The particle removal apparatus of claim 1, wherein the inner surface faces the enclosed area.

13. A particle removal system, comprising:
a reticle holder, configured to hold a reticle, wherein the reticle includes a backside;
a robotic arm, comprising a first holding arm and a second holding arm;
a particle monitoring device, configured to monitor positions and heights of particles on the backside of the reticle to obtain information about the positions and heights of the particles;
a particle removal device, disposed on the robotic arm, wherein the particle removal device comprises a solution spraying module, a sucking module, and a baffle;
wherein the particle monitoring device controls the robotic arm and the particle removal device to be aligned with the particles according to the information, and the solution spraying module is disposed on the first holding arm and is configured to spray a solution onto the particles so as to remove the particles,
wherein the baffle is disposed on the second holding arm, and the baffle comprises a first section, a second section and a support section, wherein the first section and the second section have curved shapes, and the first section and the second section are connected to the support section, wherein the solution spraying module is located between the first section and the second section, wherein the baffle is configured to be disposed over the backside of the reticle, wherein the sucking module is configured to suck the solution on the reticle with the particles being removed,
wherein the first section, the second section and the support section define an enclosed area that encompasses the particles to be removed, wherein the sucking module comprises a plurality of sucking holes, and the sucking holes are formed on an inner surface of the baffle, and the solution in the enclosed area is directed towards the sucking holes.

14. The particle removal system of claim 13, wherein the particle removal device comprises:
a gas emitting module, configured to emit a gas onto the backside of the reticle for drying the backside.

15. The particle removal system of claim 13, wherein sucking module is integrally formed on the inner side of the bottom of the baffle.

16. The particle removal system of claim 13, wherein the baffle comprises an air emitting module, disposed on the outer side of the bottom of the baffle, and the air emitting module comprises a long curved air-emitting groove;
wherein the sucking module is integrally formed on the inner side of the bottom of the baffle.

17. The particle removal system of claim 13, wherein a distance is formed between the baffle and the backside of the reticle.

18. The particle removal apparatus of claim 13, wherein the baffle has a bottom surface facing the backside of the reticle, and the inner surface does not face the backside of the reticle.

19. A particle removal apparatus, comprising:
a reticle holder, configured to hold a reticle;
a robotic arm, comprising a first holding arm and a second holding arm; and
a particle removal device, disposed on the robotic arm, wherein the particle removal device comprises a solution spraying module, a baffle and a sucking module;
wherein the robotic arm and the particle removal device are configured to align with a particle on a backside of the reticle, and the solution spraying module is disposed on the first holding arm and is configured to spray a solution onto the particle remove the particle;
wherein a distance is formed between the baffle and the backside of the reticle,
wherein the baffle is disposed on the second holding arm, and the baffle comprises a first section, a second section and a support section, wherein the first section and the second section have curved shapes, and the first section and the second section are connected to the support section, wherein the solution spraying module is located between the first section and the second section, wherein the baffle is configured to be disposed over the backside of the reticle, wherein the sucking module is configured to suck the solution on the reticle with the particle being removed,
wherein the first section, the second section and the support section define an enclosed area that encompasses the particle to be removed, wherein the sucking module comprises a plurality of sucking holes, and the sucking holes are formed on an inner surface of the baffle, and the solution in the enclosed area is directed towards the sucking holes.

20. The particle removal apparatus of claim 19, wherein the baffle has a bottom surface facing the backside of the reticle, and the bottom surface is different from the inner surface.

* * * * *